United States Patent
Kwon et al.

(10) Patent No.: US 11,914,001 B2
(45) Date of Patent: Feb. 27, 2024

(54) POWER CONTROL DEVICE AND OPEN-CIRCUIT FAULT DIAGNOSIS METHOD THEREOF

(71) Applicants: HYUNDAI MOTOR COMPANY, Seoul (KR); KIA CORPORATION, Seoul (KR); YURA CORPORATION CO., LTD., Seongnam-si (KR)

(72) Inventors: Soon Myung Kwon, Suwon-si (KR); Jung Hyeon Bae, Yongin-si (KR); Hyo Geun Kwak, Hwaseong-si (KR); Sae Rom Kim, Seoul (KR); Jeong Hyun Park, Yongin-si (KR); Young Hoo Yoon, Suwon-si (KR)

(73) Assignees: HYUNDAI MOTOR COMPANY, Seoul (KR); KIA CORPORATION, Seoul (KR); YURA CORPORATION CO., LTD., Seongnam-si (KR)

( * ) Notice: Subject to any disclaimer, the term of this patent is extended or adjusted under 35 U.S.C. 154(b) by 347 days.

(21) Appl. No.: 17/241,354

(22) Filed: Apr. 27, 2021

(65) Prior Publication Data

US 2022/0091193 A1 Mar. 24, 2022

(30) Foreign Application Priority Data

Sep. 21, 2020 (KR) .................. 10-2020-0121744

(51) Int. Cl.
*G01R 31/54* (2020.01)
*B60L 3/00* (2019.01)
*B60L 58/20* (2019.01)

(52) U.S. Cl.
CPC ............ *G01R 31/54* (2020.01); *B60L 3/0007* (2013.01); *B60L 3/0023* (2013.01); *B60L 3/0046* (2013.01);
(Continued)

(58) Field of Classification Search
CPC ..... G01R 31/54; B60L 3/0007; B60L 3/0023; B60L 3/0046; B60L 58/20;
(Continued)

(56) References Cited

U.S. PATENT DOCUMENTS

2003/0029654 A1* 2/2003 Shimane .................. B60K 6/28
903/917
2010/0271123 A1* 10/2010 Forrester ............... H03F 1/3247
330/149

(Continued)

FOREIGN PATENT DOCUMENTS

KR 10-2022-0026873 A 3/2022

*Primary Examiner* — Steven L Yeninas
*Assistant Examiner* — Dilara Sultana
(74) *Attorney, Agent, or Firm* — MORGAN, LEWIS & BOCKIUS LLP

(57) ABSTRACT

A power control device configured for diagnosing an open-circuit fault occurring in a power system of an autonomous vehicle and an open-circuit diagnosis method thereof, may include a power control switch that selectively connects or separates main power output from the first power supply and auxiliary power output from the second power supply, and a processor that determines a possibility of an open-circuit fault of a vehicle power source based on a current flowing through the power control switch and determines whether it is possible to drive an electric load with an output power of the second power supply alone and determine an open-circuit position based on an output of the first power supply when there is the possibility of the open-circuit fault.

19 Claims, 13 Drawing Sheets

(52) U.S. Cl.
CPC ...... *B60L 58/20* (2019.02); *G05D 2201/0213*
(2013.01)

(58) Field of Classification Search
CPC .... G05D 2201/0213; Y02T 10/70; H02J 9/06;
H02J 1/06; H02J 9/061; B60R 16/0232;
B60R 16/005; B60R 16/023; B60R 16/03;
B60W 60/0023; B60W 50/0205; B60W
2050/0005; B60W 2050/021; B60Y
2306/15; B60Y 2400/3084; B60Y
2400/3086
See application file for complete search history.

(56) References Cited

U.S. PATENT DOCUMENTS

| | | | |
|---|---|---|---|
| 2019/0198899 A1* | 6/2019 | Saito | H01M 8/04544 |
| 2020/0041558 A1* | 2/2020 | Enslin | G01R 31/50 |
| 2020/0143609 A1* | 5/2020 | Neelakantan | H02J 9/06 |
| 2022/0063414 A1 | 3/2022 | Kim et al. | |
| 2022/0072965 A1* | 3/2022 | Mazaki | B60L 53/12 |

\* cited by examiner

POWER CONTROL DEVICE AND OPEN-CIRCUIT FAULT DIAGNOSIS METHOD THEREOF

CROSS-REFERENCE TO RELATED APPLICATION

The present application claims priority to Korean Patent Application No. 10-2020-0121744, filed on Sep. 21, 2020, the entire contents of which is incorporated herein for all purposes by this reference.

BACKGROUND OF THE INVENTION

Field of the Invention

The present invention relates to a power control device configured for diagnosing an open-circuit fault occurring in a power system of an autonomous vehicle and an open-circuit diagnosis method thereof.

Description of Related Art

In an autonomous vehicle, a controller needs to avoid an accident and stop the vehicle in unexpected emergency situations to secure the safety of occupants as a driving subject. In a general vehicle, when a fault occurs in a power system, a driver can recognize the fault and take emergency measures, and the driver himself can escape the risk of an accident.

However, when a fault occurs in a power system of an autonomous vehicle, it is necessary to implement power redundancy to enable the vehicle to be evacuated to a safe zone (e.g., a shoulder or a service center) to deal with a case in which it is hard to transfer control to a driver.

Logic for detecting an open-circuit may determine an open-circuit using a current sensor when power consumption of "0" A (zero ampere) occurs. The open-circuit may be detected through current measurement after a lamp is turned on when a controller is in a sleep state, a motor is not driven and therefore, there is a need to turn on a lamp unnecessarily.

For example, in the case of a current sensor for fault diagnosis of a PSU switch with a current capacity of about 150 A to 250 A, the current sensor has a measurement range of −300 A to +300 A with a margin of measurement range. Even when a high-performance sensor having a measurement error of ±1% has been used, the output of the current sensor may be actually ±3 A because a measurement error of ±3 A exists in a case where the output of the current sensor is "0" A.

Therefore, a method of determining an open-circuit by measuring a current of "0" A through the output of the current sensor is not suitable for diagnosis of vehicle wiring through which a large current flows.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a power control device configured for diagnosing an open-circuit fault and an open-circuit position using a power distribution structure of a vehicle, and a method for diagnosing an open-circuit fault.

The technical problems to be solved by the present inventive concept are not limited to the aforementioned problems, and any other technical problems not mentioned herein will be clearly understood from the following description by those skilled in the art to which various exemplary embodiments of the present invention pertains.

According to various aspects of the present invention, a power supply device positioned between a power supply device connected to an output terminal of a first power supply and a second power supply includes a power control switch that connects and separate main power output from the first power supply and auxiliary power output from the second power supply; and a processor that determines a possibility of an open-circuit fault of a vehicle power source based on a current flowing through the power control switch and determines whether it is possible to drive an electric load with an output power of the second power supply alone and determines an open-circuit position based on an output of the first power supply when there is the possibility of the open-circuit fault.

The processor may determine that there is the open-circuit fault when it is detected using a current sensor that a current does not flow through the power control switch or a current flows through the power control switch in a reverse direction, which is a direction opposite to a predetermined direction.

The processor may measure an output voltage of the first power supply using a voltage sensor when a current does not flow through the power control switch and determine that there is the open-circuit fault between the power distribution device and the power control device according to the measured output voltage.

The processor may determine whether the first power supply does not limit an output thereof using vehicle communication when a current flows through the power control switch in the reverse direction and determine that there is the open-circuit fault between the first power supply and the power distribution device when the first power supply does not limit the output.

The processor may determine that there is the open-circuit fault between the first power supply and the power distribution device when the first power supply does not limit the output and a current is not supplied from the first power supply when the current flows through the power control switch in the reverse direction.

The processor may determine that there is the open-circuit fault between the first power supply and the power distribution device when the first power supply does not limit the output and the electric load is driven with the output power of the second power supply alone when the current flows through the power control switch in the reverse direction.

The processor may determine that there is the open-circuit fault between the first power supply and the power distribution device when the first power supply does not limit the output, the electric load is driven with the output power of the second power supply alone, and a current is not supplied from the first power supply, when the current flows through the power control switch in the reverse direction.

The processor may determine an amount of power consumption based on power supplied to each electric load, identify an amount of decrease in a battery SOC value of the second power supply using a sensor, determine whether a difference between the amount of power consumption and the amount of decrease in the battery SOC is within a tolerance range, and determine that the electric load is driven with the output power of the second power supply alone when the difference is within the tolerance range.

According to various aspects of the present invention, an open-circuit diagnosis method for a power supply device includes determine a possibility of an open-circuit fault of a vehicle power source based on a current flowing through a power control switch that selectively connects or separates main power output from the first power supply and auxiliary power output from the second power supply and determining whether it is possible to drive an electric load with an output power of the second power supply alone and determining an open-circuit position based on an output of the first power supply when there is the possibility of the open-circuit fault.

The determining of the possibility of the open-circuit fault may include determining a current flow of the power control switch using a current sensor, and determining that there is the possibility of the open-circuit fault when a current does not flow the power control switch or a current flows through the power control switch in a reverse direction as a result of the determination of the current flow.

The determining of the open-circuit position may include measuring an output voltage of the first power supply using a voltage sensor when a current does not flow through the power control switch, and determining whether there is an open-circuit fault between the power distribution device and the power control device based on the output voltage of the first power supply.

The determining of the open-circuit position includes determining whether the first power supply does not limit an output thereof using vehicle communication when the current flows through the power control switch in the reverse direction.

The determining of the open-circuit position may further include determining that there is an open-circuit fault between the first power supply and the power distribution device when the first power supply does not limit the output.

The determining of the open-circuit position may include identifying an output current of the first power supply when the first power supply does not limit the output, and concluding that there is the open-circuit fault between the first power supply and the power distribution device upon determining that a current is not supplied from the first power supply.

The determining of the open-circuit position may include determining whether the electric load is driven with the output power of the second power supply alone when the first power supply does not limit the output, and concluding that there is the open-circuit fault between the first power supply and the power distribution device when the electric load is driven with the output power of the second power supply alone.

The determining of the open-circuit position may further include identifying an output current of the first power supply when the electric load is driven with the output power of the second power supply alone, and concluding that there is the open-circuit fault between the first power supply and the power distribution device upon determining that a current is not supplied from the first power supply.

The determining of whether the electric load is driven with the output power of the second power supply alone may include determining an amount of power consumption based on power supplied to each electric load, identifying an amount of decrease in a battery SOC value of the second power supply using a sensor, determining whether a difference between the amount of power consumption and the amount of the battery SOC is within a tolerance range, and concluding that there is the open-circuit fault between the first power supply and the power distribution device upon determining that the difference is within the tolerance range.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
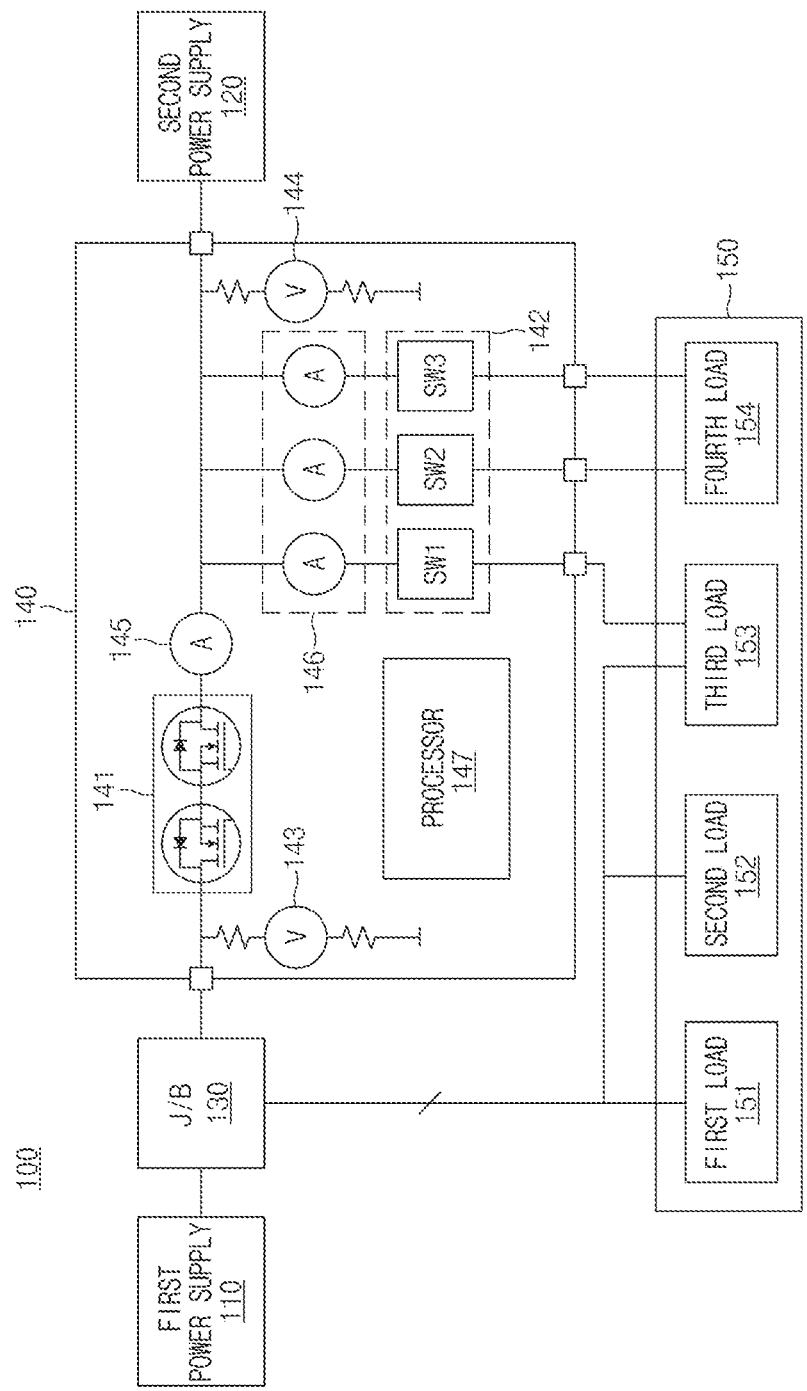
FIG. 1 is a schematic diagram illustrating a power system for an autonomous vehicle according to exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, various exemplary embodiments of the present invention will be described in detail with reference to the exemplary drawings. In adding the reference numerals to the components of each drawing, it may be noted that the identical or equivalent component is designated by the identical numeral even when they are displayed on other drawings. Furthermore, in describing the exemplary embodiment of the present invention, a detailed description of well-known features or functions will be ruled out in order not to unnecessarily obscure the gist of the present invention.

In describing the components of the exemplary embodiment according to various exemplary embodiments of the present invention, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, have the same meanings as those understood by those skilled in the art to which various exemplary embodiments of the present invention pertains. Such terms as those defined in a used dictionary are to be interpreted as having meanings equal to the contextual meanings in the relevant field of art, and are not to be interpreted as having ideal or excessively formal meanings unless clearly defined as having such in the present application.

FIG. 1 is a schematic diagram illustrating a power system for an autonomous vehicle according to exemplary embodiments of the present invention.

A power system 100 for an autonomous vehicle may include a first power supply 110, a second power supply 120, a power distribution device 130, a power control device 140, and an electric load 150.

The first power supply 110 may be a main source that supplies main power. The first power supply 110 may be a low DC-to-DC converter (LDC) that converts high voltage power output from a high voltage battery into low voltage power (e.g., power of 12V).

The second power supply 120 may be a device that supplies auxiliary power. The second power supply 120 may include an auxiliary battery (e.g., a low voltage battery or a 12V battery) used as redundancy power. The second power supply 120 may include a detector that detects a state of charge (SOC) value of a battery. For example, when the auxiliary battery is a lead-acid battery, the second power supply 120 may measure an SOC value of the battery through an Intelligent Battery Sensor (IBS). Furthermore, when the auxiliary battery is a lithium battery, the second power supply 120 may detect the SOC value of the battery through a battery management system (BMS).

The power distribution device 130 may be connected to an output terminal of the first power supply 110. The power distribution device 130 may distribute main power output (supplied) from the first power supply 110 to the power control device 140 and the electric load 150. The power distribution device 130 may be a junction box (J/B) including, for example, a fuse and/or a relay, and may be provided in an engine compartment. Although not shown in FIG. 1, as shown in the drawings to be described later, the power system 100 may include an indoor power distribution device 131 provided inside a vehicle to receive power distributed by the power distribution device 130 and distribute the power to the electric load 150.

The power control device 140 may be a power-net safety control unit (PSU) and may be positioned between the second power supply 120 and the power distribution device 130. The power control device 140 may connect (merge) or separate (cut off) output power (that is, main power) of the first power supply 110 and output power (that is, auxiliary power) of the second power supply 120. The power control device 140 may monitor bidirectional power output of the first power supply 110 and the second power supply 120 and determine a fault state of a power supply to connect or separate the main power and auxiliary power. The power control device 140 may connect the main power and the auxiliary power in a normal power state, and separate the main power and the auxiliary power in a power fault state. When the power fault is recovered, the power control device 140 may connect power that has been cut off.

The power control device 140 may identify and detect an open-circuit (at a first point) between the first power supply 110 and the power distribution device 130 and an open-circuit (at a second point) between the power distribution device 130 and the power control device 140. The power control device 140 may identify an open-circuit fault and an open-circuit position to secure a driver's safety and prevent unnecessary power consumption. When an open-circuit occurs at the first point, the first power supply 110 cannot supply power to the electric load 150. Therefore, the second power supply 120 may supply power the electric load 150 only with power charged in the auxiliary battery to enable the vehicle to perform autonomous driving. The power control device 140 may request vehicle control (e.g., evacuation control to a safety zone) that prioritizes securing the safety of occupants from an autonomous driving control device because the open-circuit fault at the first point is a fault causing the vehicle not to continuously drive. Furthermore, the power control device 140 may cut off power supplied to an unnecessary electric load to secure the safety of the occupant. When an open-circuit occurs at the second point, the first power supply 110 may supply power to all electric loads 151 to 153 connected to the main power because an output of the first power supply 110 may be normally maintained. The electric loads 153 and 154 connected to the auxiliary power may receive power from the second power supply 120. When the open-circuit has occurred at the second point, the output of the first power supply 110 cannot be connected to the second power supply 120. Therefore, the second power supply 120 cannot maintain charging of the auxiliary battery. Furthermore, there is a limit in an operation time of the electric load on a side of the auxiliary power because charging of the auxiliary battery cannot be maintained. Accordingly, the power control device 140 may request the autonomous driving control device to stop the vehicle in a safe area.

The power control device 140 may include a first power control switch 141, a second power control switch 142, a first voltage sensor 143, a second voltage sensor 144, a first current sensor 145, a second current sensor 146 and a processor 147.

The first power control switch 141 may connect or separate the main power and the auxiliary power between the first power supply 110 and the second power supply 120. The first power control switch 141 may be turned on or off according to an instruction of the processor 147. The first power control switch 141 may be turned on in a normal power state to connect dual power sources, that is, the main power and the auxiliary power. The first power control switch 141 may be turned off in a power fault state (e.g., an open-circuit fault in a wire) to separate the main power and the auxiliary power. As the first power control switch 141, a relay, a semiconductor switch (e.g., a back-to-back (B2B) switch) or the like may be used.

The second power control switch 142 may supply or cut off power to the electric loads 153 and 154 connected to the power control device 140. The second power control switch 142 may include, for example, at least one semiconductor switch or at least one relay connected for each electric load 150.

The first voltage sensor 143 may measure (detect) a voltage of the main power supplied from the first power supply 110. The first voltage sensor 143 may measure a voltage of the main power using a resistance division method. When the first power control switch 141 is turned on, a voltage measured by the first voltage sensor 143 may be equal to a voltage measured by the second voltage sensor 144 to be described later. The voltage measured by the first voltage sensor 143 may have a minute error due to the resistance of the first power control switch 141 and the current sensors 145 and 146. When the first power control switch 141 is turned off, a voltage measured by the first voltage sensor 143 may be different from a voltage measured by the second voltage sensor 144 according to characteristics of the voltage sensor. For example, in the case of measuring a voltage using a resistance division method, the first voltage sensor 143 may measure a value close to "0" V according to a pull-down resistance.

The second voltage sensor 144 may measure a voltage of the auxiliary power supplied from the second power supply 120. Like the first voltage sensor 143, the second voltage sensor 144 may measure the voltage of the auxiliary power using a resistance division method.

The first current sensor 145 may measure a current flowing through the first power control switch 141. The first current sensor 145 may measure a switch current using a shunt resistance method, a method of measuring a current through the resistance of the first power control switch 141, and/or a hall sensor method.

The second current sensor 146 may measure a current supplied for each electric load 150. The second current sensor 146 may measure a load current using a shunt resistance method, a method of measuring a current through the resistance of the second power control switch 142, and/or a hall sensor method.

The processor 147 may control the overall operations of the power control device 140. The processor 147 may be implemented with at least one of an application specific integrated circuit (ASIC), a digital signal processor (DSP), a programmable logic device (PLD), field programmable gate arrays (FPGAs), a central processing unit (CPU), microcontrollers (MCUs), and/or microprocessors. The memory may be a non-transitory storage medium that stores instructions to be executed by the processor 147. The memory may be implemented with at least one of storage media, such as a flash memory, a hard disk, an SD card (Secure Digital Card), a random access memory (RAM), a static random access memory (SRAM), a read only memory ROM), a Programmable Read Only Memory (PROM), an Electrically Erasable and Programmable ROM (EEPROM), a Erasable and Programmable ROM (EPROM), and/or a register.

The processor 147 may determine a current flow direction based on a current flowing through the first power control switch 141 (that is, a switch current). When the switch current measured by the first current sensor 145 has a positive (+) value, the processor 147 may determine the current flow direction as a forward direction. Meanwhile, when the switch current measured by the first current sensor 145 has a negative (−) value, the processor 147 may determine the current flow direction as a reverse direction. Here, the forward direction may mean that the switch current flows from the first power supply 110 toward the second power supply 120, and the reverse direction may mean that the switch current flows from the second power supply 120 toward the first power supply 110.

The processor 147 may determine an open-circuit fault and an open-circuit portion (a fault position) of wirings based on a current (switch current) flowing through the first power control switch 141, an output voltage and/or output current of the first power supply 110, and/or whether an electric load is driven only using output power of the second power supply 120.

The processor 147 may determine whether there is a possibility of an open-circuit fault based on the current flowing through the first power control switch 141. When the current flows through the first power control switch 141 in the forward direction, the processor 147 may determine a power state of the vehicle as a normal state. When the current does not flow through the first power control switch 141 or flows into the reverse direction, the processor 147 may determine that there is a possibility of an open-circuit fault of power wirings (suspicion of open-circuit). When an open-circuit fault is suspected, the processor 147 may determine an open-circuit position based on whether the electric load 150 is driven with only the output power of the second power supply 120 and/or the output voltage and/or output current of the first power supply 110.

When the current does not flow through the first power control switch 141 for a predetermined time period, the processor 147 may turn off the first power control switch 141 and identify an output voltage of the first power supply 110. The processor 147 may measure a current (current value) flowing through the first power control switch 141 through the first current sensor 145. When the measured current falls within a reference range (e.g., "0" A±sensor error), the processor 147 may determine that there is a possibility of an open-circuit fault (at the first point) between the power distribution device 130 and the power control device 140. When it is determined that there is a possibility of an open-circuit fault, the processor 147 may turn off the first power control switch 141 to separate the main power and the auxiliary power. The processor 147 may measure an output voltage of the first power supply 110 through the first voltage sensor 143. For example, when a current through the first power control switch 141 is "0" A for three seconds, the processor 147 may turn off the first power control switch 141 and identify an output voltage of the first power supply 110.

The processor 147 may determine that an open-circuit fault has occurred when the output voltage (that is, main power voltage) of the first power supply 110 falls within a range of ("0" V±sensor error). In other words, when the output of the first power supply 110 is not detected by the first voltage sensor 143, the processor 147 may determine an open-circuit fault. Meanwhile, the processor 147 may determine that the power is normal when the output voltage of the first power supply 110 is measured by the first voltage sensor 143 as being within a range of 12 V±sensor error.

When the switch current flows in the reverse direction, the processor 147 may determine that there is a possibility of an open-circuit fault at the output side of the first power supply 110. When there is a possibility of an open-circuit fault on the output side of the first power supply 110, the processor 147 may determine an open-circuit fault (at the first point) between the first power supply 110 and the power distribution device 130 based on the output current of the first power supply 110, the amount of decrease in an SOC value of the battery, a duration and/or the like.

The processor 147 may determine whether the output current of the first power supply 110 is a reference current (e.g., "0" A±sense error) using vehicle communication under the condition that the first power supply 110 does not limit the output. Communication technologies such as a Controller Area Network (CAN), a Media Oriented Systems Transport (MOST) network, a Local Interconnect Network (LIN), Ethernet, and/or an X-by-Wire (Flexray) may be applied as vehicle communication.

The processor 147 may determine whether power is supplied to the electric load 150 by use of only the auxiliary power output from the second power supply 120. The processor 147 may determine the amount of power consumption (power consumption) using a battery voltage measured by the second voltage sensor 144, a switch current measured by the first current sensor 145, and a load current flowing through each electric load 150 measured by the second current sensor 146. For example, the processor 147 may identify the amount of decrease in the SOC value of the battery through the IBS, and determine a power consumption $P_{BATT}$ using the following [Equation 1] while a current measured by the first current sensor 145 has a negative value.

$$P_{BATT}=[V_{BATT} \times (I_{PSU.switch}+I_{PSU.load})] \times T \qquad \text{[Equation 1]}$$

Here, $V_{BATT}$ is an output voltage of the second power supply 120, that is, the battery voltage, $I_{PSU.switch}$ is a current (switch current) flowing through the first power control switch 141, and $I_{PSU.load}$ is a current (load current) flowing each electric load, and T is a measurement period.

The processor 147 may determine the amount of power consumption by summing (integrating) the power consumption $P_{BATT}$. The processor 147 may determine whether an error between the determined amount of power consumption and the amount of decrease in the battery SOC is within a preset tolerance. When the error between the determined amount of power consumption and the amount of decrease in the battery SOC is within the preset tolerance, the processor 147 may determine that the electric load 150 operates only with the auxiliary power.

The processor 147 may determine whether a phenomenon in which a current of "0" A flows through the first power supply 110 under the condition that the first power supply 110 does not limit an output and/or a phenomenon in which only the second power supply 120 supplies power to the electric load 150 continues for a predetermined time period (e.g., 3 seconds to 10 seconds. Here, the predetermined time period may be determined in consideration of a duration of a state in which a rapid current consumption of the MDPS and/or an active roll control system (ARS) occurs.

The processor 147 may determine an open-circuit fault at the second point when the first power supply 110 does not limit an output for a preset time in a situation in which the switch current flows in the reverse direction. The processor 147 may determine an open-circuit fault at the second point when an output current of the first power supply 110 is "0" A while the switch current flows in the reverse direction. The processor 147 may determine the open-circuit fault at the second point when the electric load 150 is driven using only the auxiliary power output from the second power supply 120 while the switch current flows in the reverse direction. The processor 147 may determine the open-circuit fault at the second point when the output current of the first power supply 110 is "0" A while the switch current flows in the reverse direction and the electric load 150 is driven using only the auxiliary power output from the second power supply 120.

The electric load 150 may operate by receiving the main power and/or the auxiliary power. The electric load 150 may include a first load 151, a second load 152, a third load 153, and a fourth load 154 which are mounted on the vehicle. The first load 151 may include a load directly connected to the power distribution device 130, for example, an engine management system (EMS) and/or a cooling pump. The second load 152 is a load connected to the indoor power distribution device 131 and may include convenience devices such as a seat controller, multimedia, lamps and/or the like. The third load 153 is a load to which dual power sources are connected through the power distribution device 130 and the power control device 140, and may include motor driving power steering (MDPS), airbags, and/or lamps for safety (e.g., headlamps, emergency lights, and/or stop lights), and the like. The fourth load 154 is a load that receives power from the power control device 140 and may include a backup brake system or the like.

Next, a power distribution structure supplied by the power system 100 when vehicle power is normal and the first power control switch 141 is turned on will be described with reference to FIG. 2, FIG. 3, FIG. 4 and FIG. 5.

Figure 2:
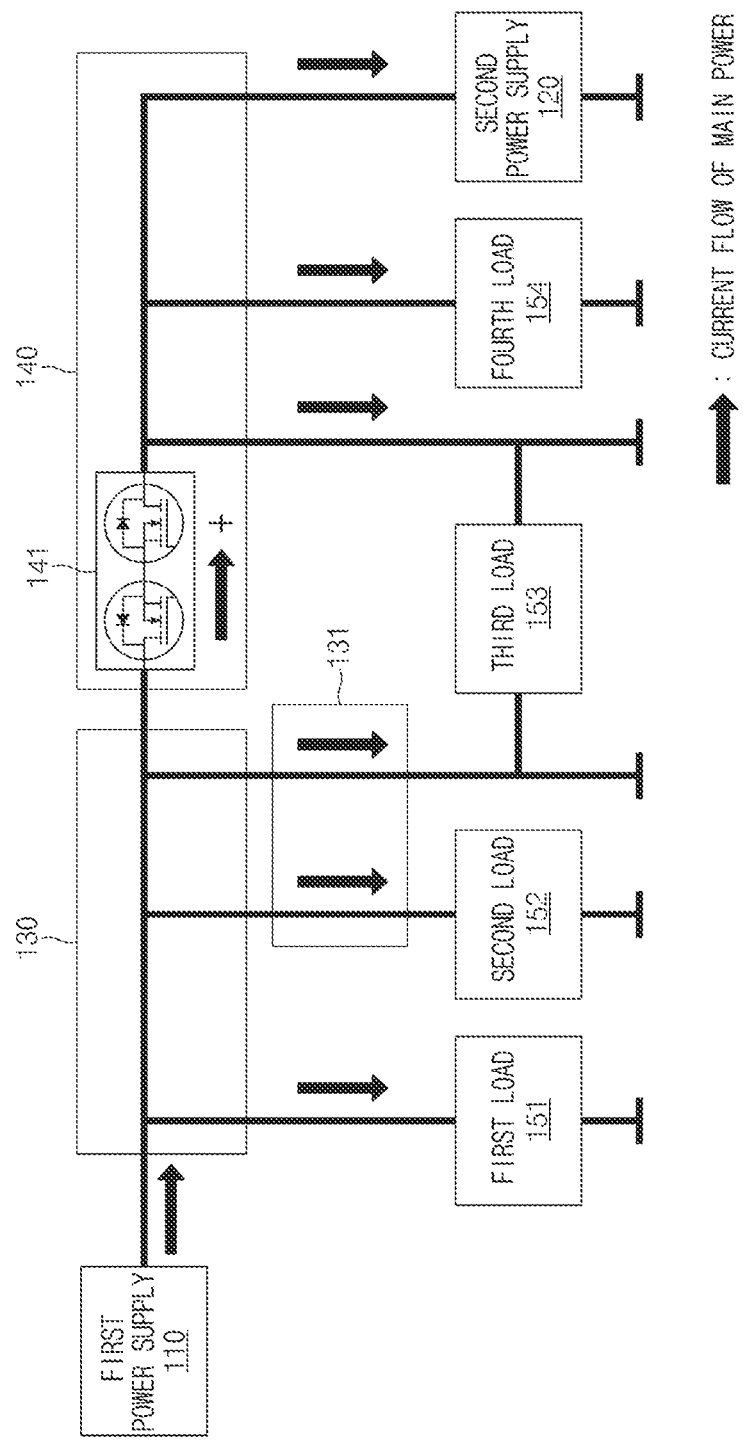
FIG. 2 is a diagram illustrating a first power distribution structure of the power system shown in FIG. 1.

FIG. 2 is a diagram illustrating a first power distribution structure of the power system shown in FIG. 1;

When the wiring of the power system 100 is normal, the power control device 140 may maintain the first power control switch 141 in an on state to supply main power (e.g., 12V) output from the first power supply 110 to a vehicle. In the instant case, a current may flow from the first power supply 110 to the second power supply 120 (that is, in the forward direction) in the first power control switch 141.

The first power supply 110 may supply main power to the electric loads 151 to 153 of the vehicle through the power distribution device 130 and the indoor power distribution device 131. The second power supply 120 may supply the auxiliary power to the electric loads 153 and 154 connected to the second power supply 120 through the power control device 140. In the instant case, the second power supply 120 may maintain charging of the auxiliary battery.

Figure 3:
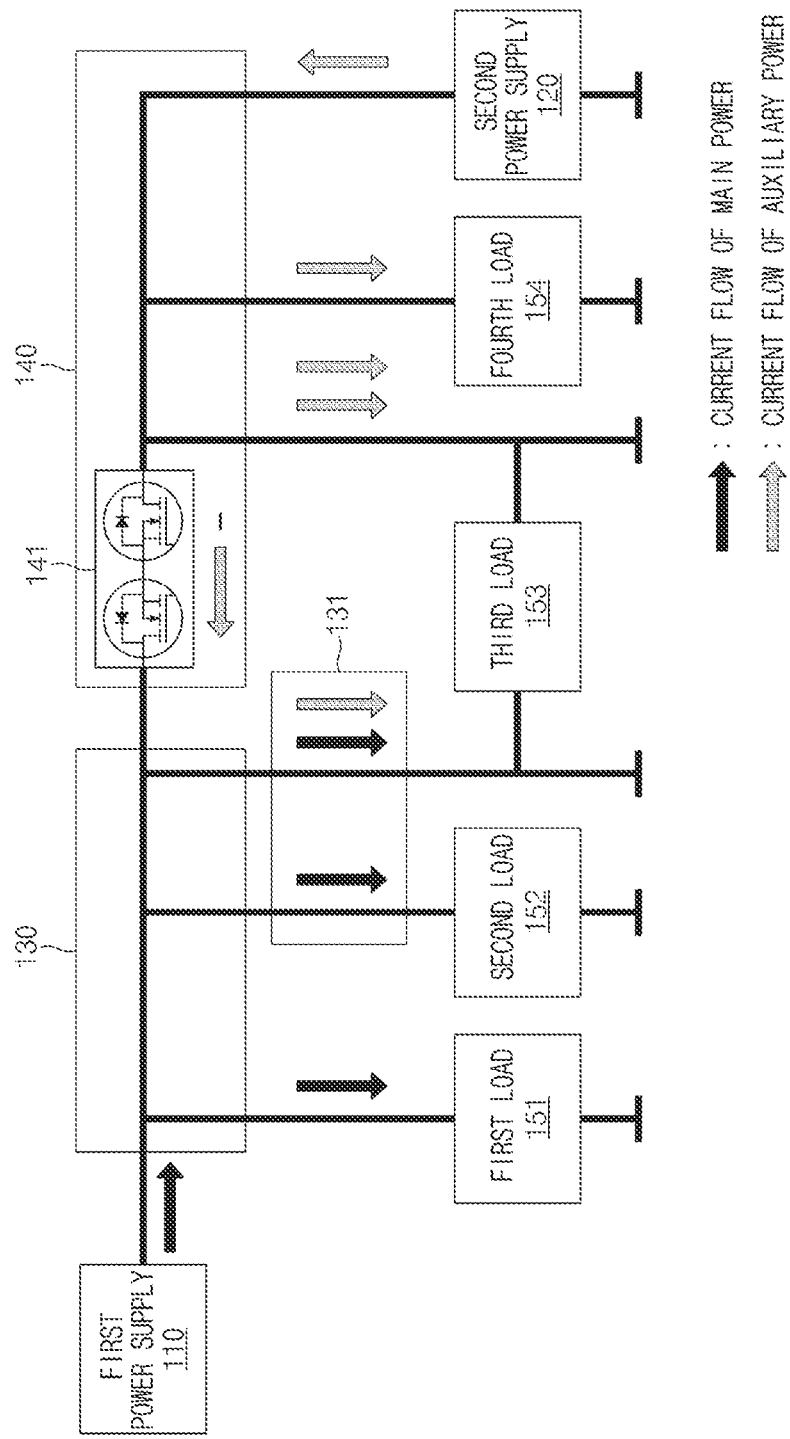
FIG. 3 is a diagram illustrating a second power distribution structure of the power system shown in FIG. 1.

FIG. 3 is a diagram illustrating a second power distribution structure of the power system shown in FIG. 1.

When current consumption of the first power supply 110 increases intermittently (for example, when the instantaneous current consumption due to the sudden steering of the MDPS becomes greater than the output current of the LDC) or when the output of the first power supply 110 is limited to improve the energy efficiency of the vehicle because the charging of an auxiliary battery is very good, it may be possible to supply power to the electric loads 153 and 154 using the output power of the second power supply 120. In the instant case, a current may flow from the second power supply 120 to the first power supply 110 (that is, in the reverse direction) in the first power control switch 141 of the power control device 140.

Figure 4:
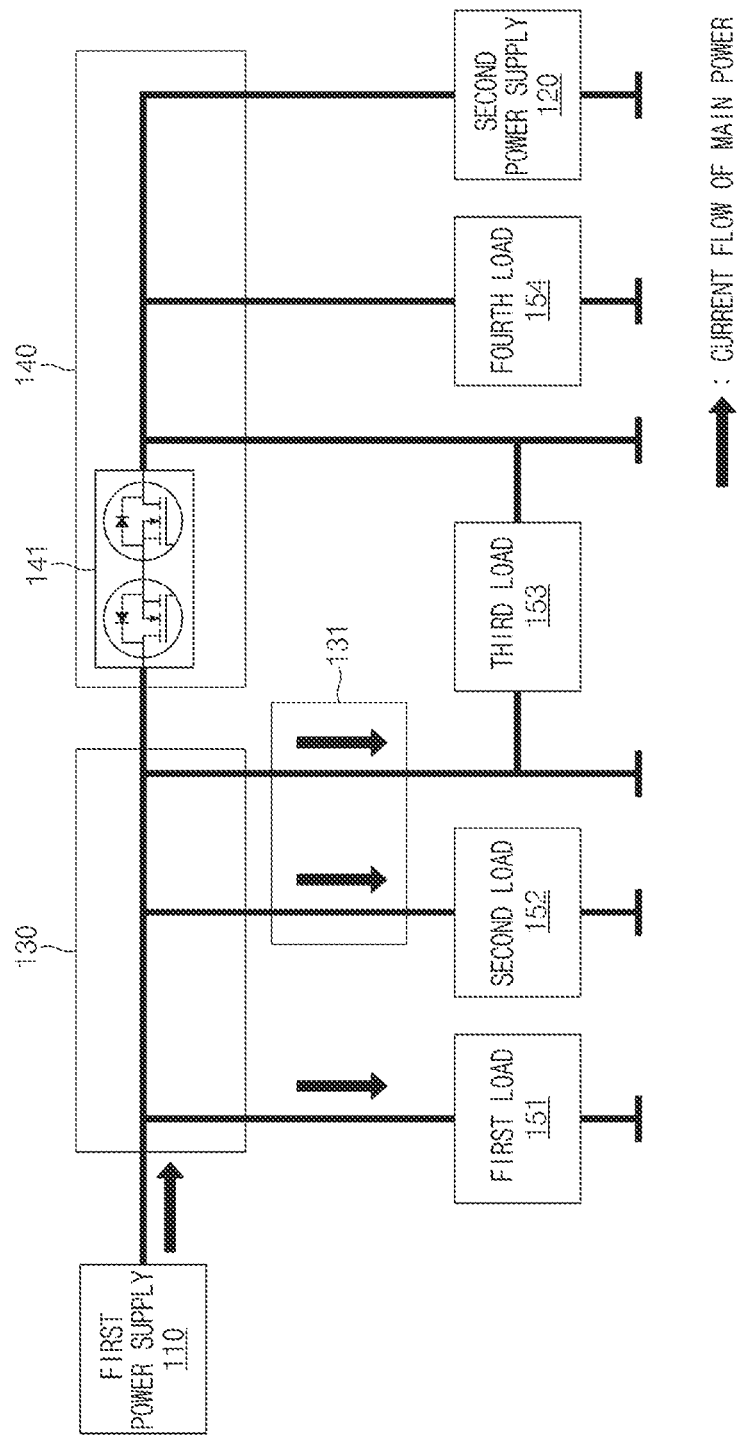
FIG. 4 is a diagram illustrating a third power distribution structure of the power system shown in FIG. 1.

FIG. 4 is a diagram illustrating a third power distribution structure of the power system shown in FIG. 1.

In the case where the power consumption of the vehicle is in a very stable state even when the first power control switch 141 of the power control device 140 is turned on, a very small current close to "0" A may flow through the power control device 140. The power distribution structure may be switched to the power distribution structure shown in FIG. 2, for example, when the battery charging current of the second power supply 120 may be close to "0" A because the output voltage of the first power supply 110 and the output voltage (battery voltage) of the second power supply 120 become the same, when there is little current consumption of an auxiliary brake system as when the vehicle is driving on a highway, or when there is little current consumption of MDPS through straight driving.

Figure 5:
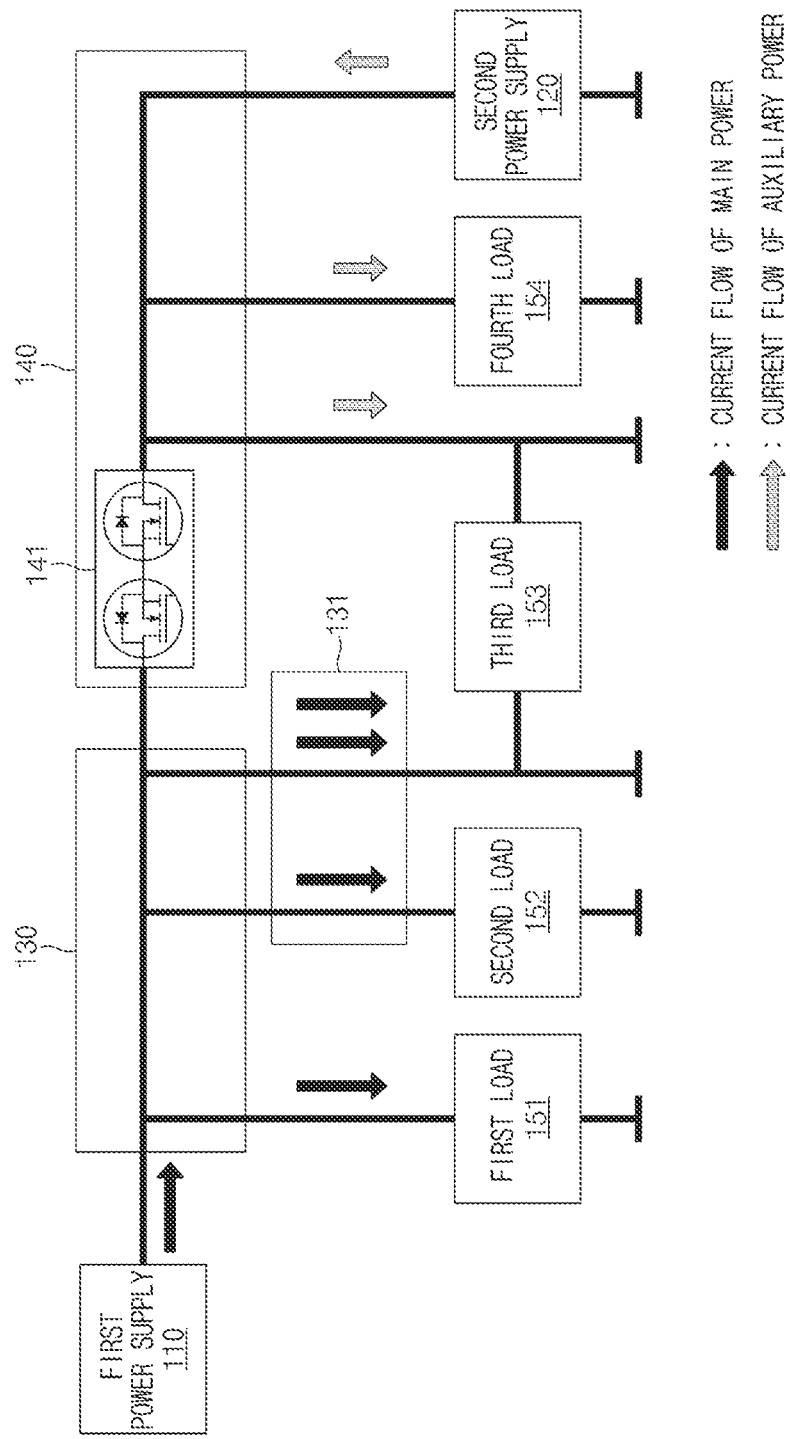
FIG. 5 is a diagram illustrating a fourth power distribution structure of the power system shown in FIG. 1.

FIG. 5 is a diagram illustrating a fourth power distribution structure of the power system shown in FIG. 1.

When the wiring is normal, but no current flows through the first power control switch 141 because the voltages at both end portions of the first power control switch 141 are the same, the second power supply 120 may supply power to the electric loads 153 and 154. For example, the power of the second power supply 120 may be supplied to an electric load connected to the power control device 140 due to, for example, line-to-line resistance according to the length of a wiring path, and power is not supplied from the first power supply 110, a state in which the voltages at both end portions of the first power control switch 141 are the same cannot be maintained for a long time as the power stored in the second power supply 120 is consumed. Therefore, switching to the first power distribution structure may be performed within several seconds to several tens of seconds.

Next, a power distribution structure of the power system 100 when an open-circuit fault occurs in a vehicle power supply will be described with reference to FIG. 6 and FIG. 7.

Figure 6:
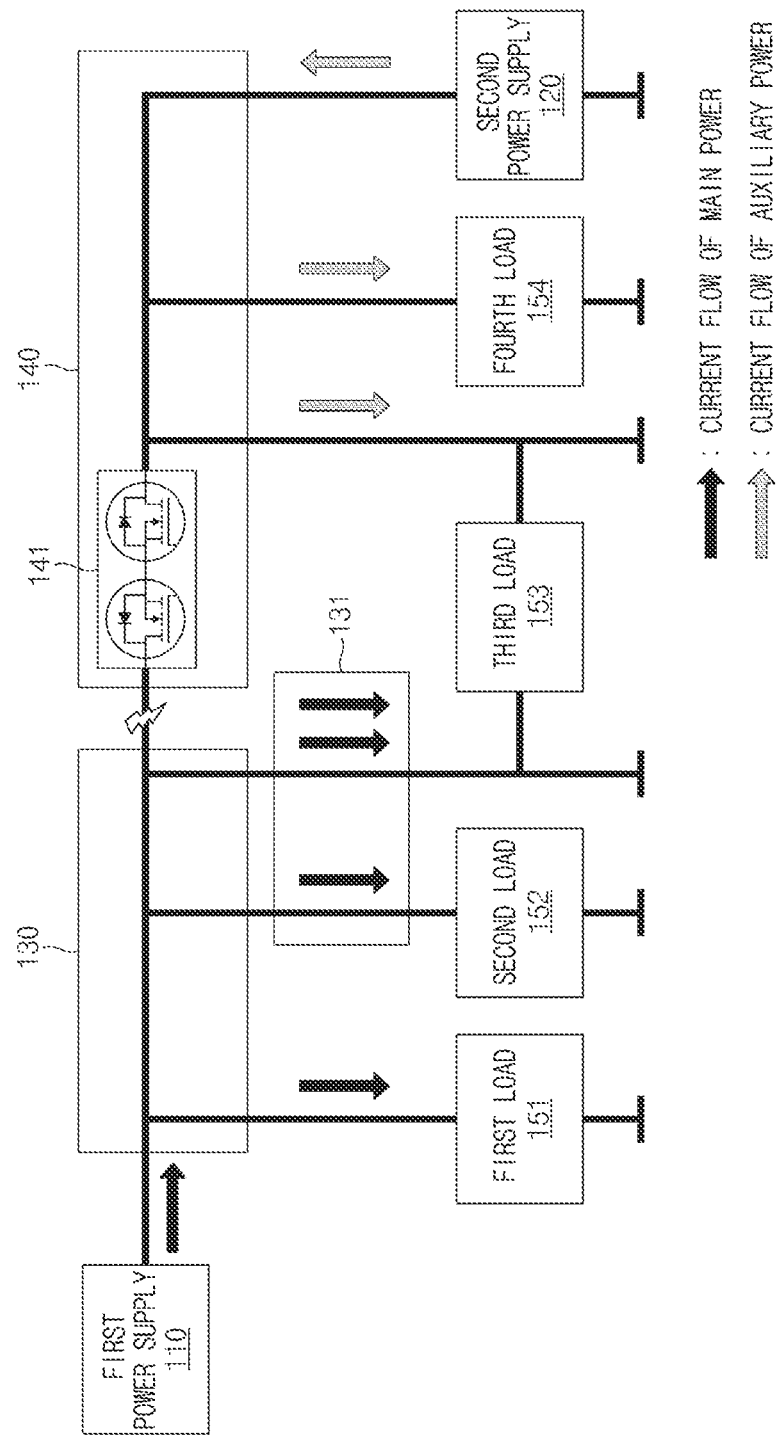
FIG. 6 is a diagram illustrating a power distribution structure of a power system according to various exemplary embodiments of the present invention.

FIG. 6 is a diagram illustrating a power distribution structure of a power system according to various exemplary embodiments of the present invention.

Referring to FIG. 6, when an open-circuit occurs between the power distribution device 130 and the power control device 140, the first power supply 110 may supply power to the first load 151 and/or the third load 153 through the power distribution device 130. Furthermore, the first power supply 110 may supply power to the second load 152 or the third load 153 through the power distribution device 130 and the indoor power distribution device 131.

The second power supply 120 may supply power to the third load 153 and the fourth load 154 through the power control device 140.

Figure 7:
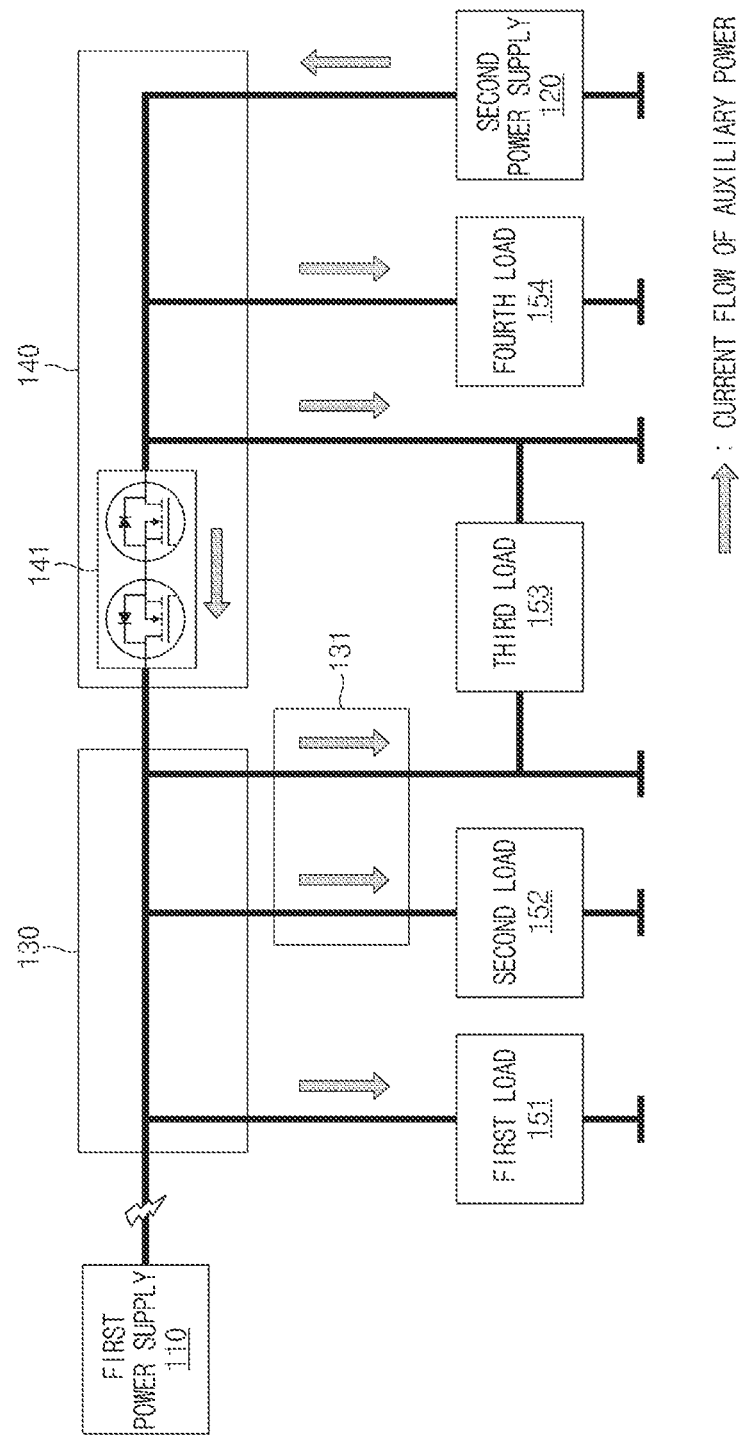
FIG. 7 is a diagram illustrating a power distribution structure of a power system according to various exemplary embodiments of the present invention.

FIG. 7 is a diagram illustrating a power distribution structure of a power system according to various exemplary embodiments of the present invention.

Referring to FIG. 7, when an open-circuit occurs between the first power supply 110 and the power distribution device 130, that is, when an open-circuit occurs on the output side of the first power supply 110, the first power supply 110 cannot supply power to the electric load 150.

The second power supply 120 may solely supply power to the electric load 150 thus allowing the vehicle to maintain autonomous driving. The vehicle control device may perform vehicle control (e.g., stopping on a shoulder) that prioritizes ensuring the safety of occupants because the open-circuit fault on the output side of the first power supply 110 is a fault that makes it difficult to continue driving the vehicle.

Figure 8:
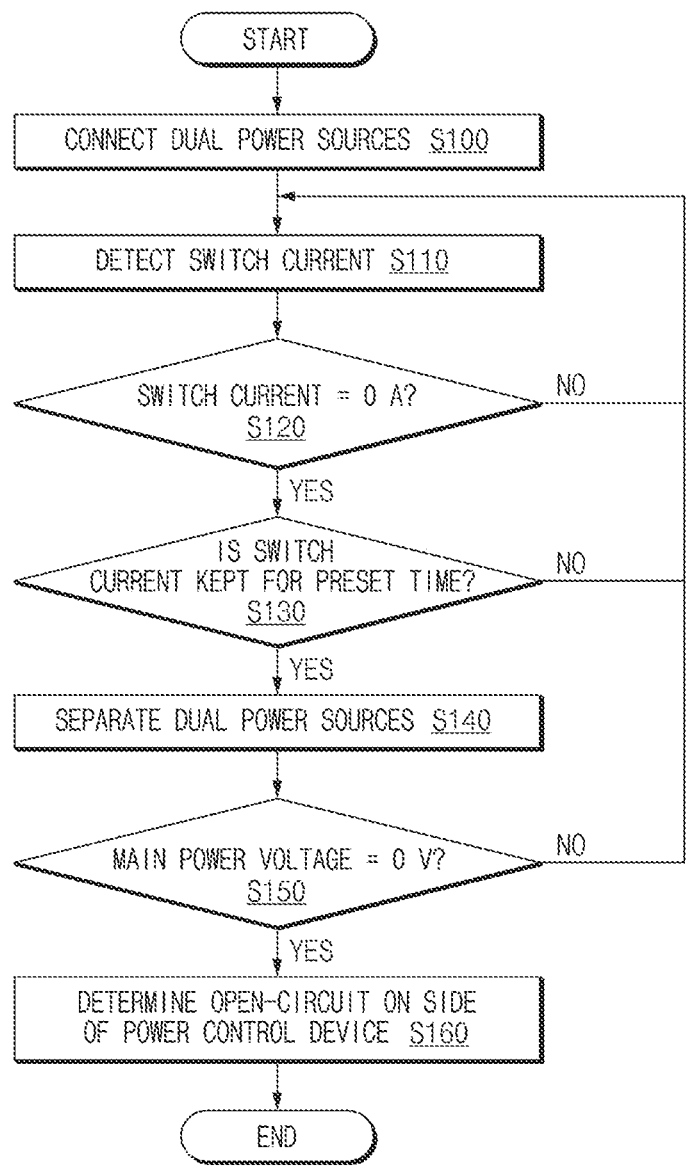
FIG. 8 is a flowchart illustrating an open-circuit diagnosis method for a power control device according to various exemplary embodiments of the present invention.

FIG. 8 is a flowchart illustrating an open-circuit diagnosis method for a power control device according to various exemplary embodiments of the present invention.

The power control device 140 may connect dual power sources during autonomous driving (S100). The processor 147 of the power control device 140 may turn on the first power control switch 141 to connect main power output from the first power supply 110 and the auxiliary power output from the second power supply 120.

The power control device 140 may detect a switch current in a state where being connected to dual power sources (S110). The processor 147 may measure a current (that is, switch current) flowing through the first power control switch 141 using the first current sensor 145.

The power control device 140 may identify whether the switch current detected within a tolerance range is equal to "0" A (S120). When the switch current is equal to "0" A within the tolerance range, the processor 147 may determine that a current does not flow through the first power control switch 141. The tolerance range may be determined in advance based on a measurement error range of the first current sensor 145.

When the switch current is equal to "0" A, the power control device 140 may identify whether the switch current is kept at "0" A for a preset time (S130). In other words, the power control device 140 may determine whether a current does not flow through the first power control switch 141 for a preset time.

The power control device 140 may separate dual power sources when the switch current is kept at "0" A for a preset time (S140). The processor 147 of the power control device 140 may turn off the first power control switch 141 to separate the main power and the auxiliary power.

The power control device 140 may determine whether a main power voltage is "0" V after the dual power sources are separated (S150). The power control device 140 may determine whether the output voltage of the first power supply 110 measured by the first voltage sensor 143 is "0" V within a tolerance range. In the instant case, the tolerance range may be set in advance based on a measurement error range of the first voltage sensor 143.

When the main power voltage is "0" V, the power control device 140 may determine an open-circuit fault on the side of the power control device 140 (S160). When the voltage is not supplied from the first power supply 110, the power control device 140 may determine that an open-circuit has occurred between the power distribution device 130 and the power control device 140.

Figure 9:
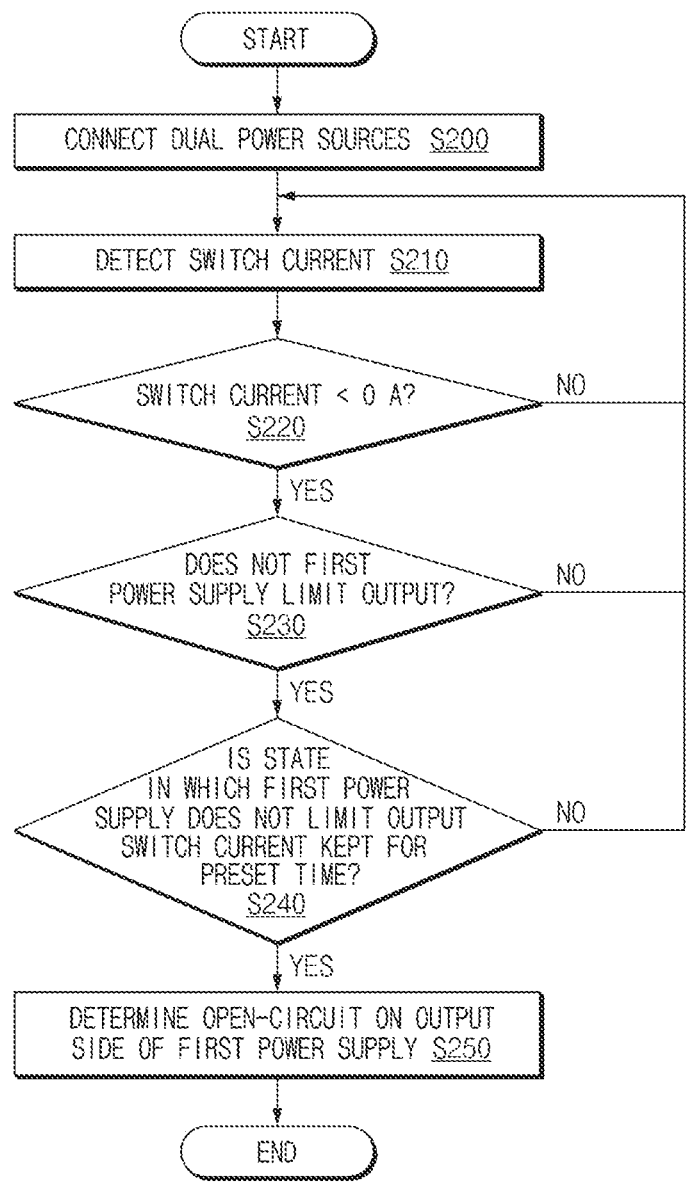
FIG. 9 is a flowchart illustrating an open-circuit diagnosis method for a power control device according to various exemplary embodiments of the present invention.

FIG. 9 is a flowchart illustrating an open-circuit diagnosis method for a power control device according to various exemplary embodiments of the present invention.

The power control device 140 may connect the dual power sources during autonomous driving (S200). The processor 147 of the power control device 140 may turn on the first power control switch 141 to connect main power output from the first power supply 110 and the auxiliary power output from the second power supply 120.

The power control device 140 may detect a switch current while the dual power sources are being connected (S210). The processor 147 may measure a current flowing through the first power control switch 141 using the first current sensor 145.

The power control device 140 may identify whether a flow direction of the switch current is the reverse direction (S220). The processor 147 may identify whether a current measured by the first current sensor 145 is less than "0" A. When the current measured by the first current sensor 145 is less than "0" A, the processor 147 may determine the flow direction of the switch current as a reverse direction. When the current measured by the first current sensor 145 is greater than "0" A, the processor 147 may determine the flow direction of the switch current as a forward direction.

The power control device 140 may determine whether the first power supply 110 does not limit an output (S230). The processor 147 of the power control device 140 may determine whether the first power supply 110 does not limit an output through communication with the first power supply 110.

The power control device 140 may identify whether a state in which the first power supply 110 does not limit an output is maintained for a preset time (S240).

The power control device 140 may determine an open-circuit fault on the output side of the first power supply 110 when a state in which the first power supply 110 does not limit an output is maintained for a preset time (S250). The processor 147 may determine that an open-circuit has occurred between the first power supply 110 and the power distribution device 130 when the first power supply 110 does not limit the output for a preset time.

Figure 10:
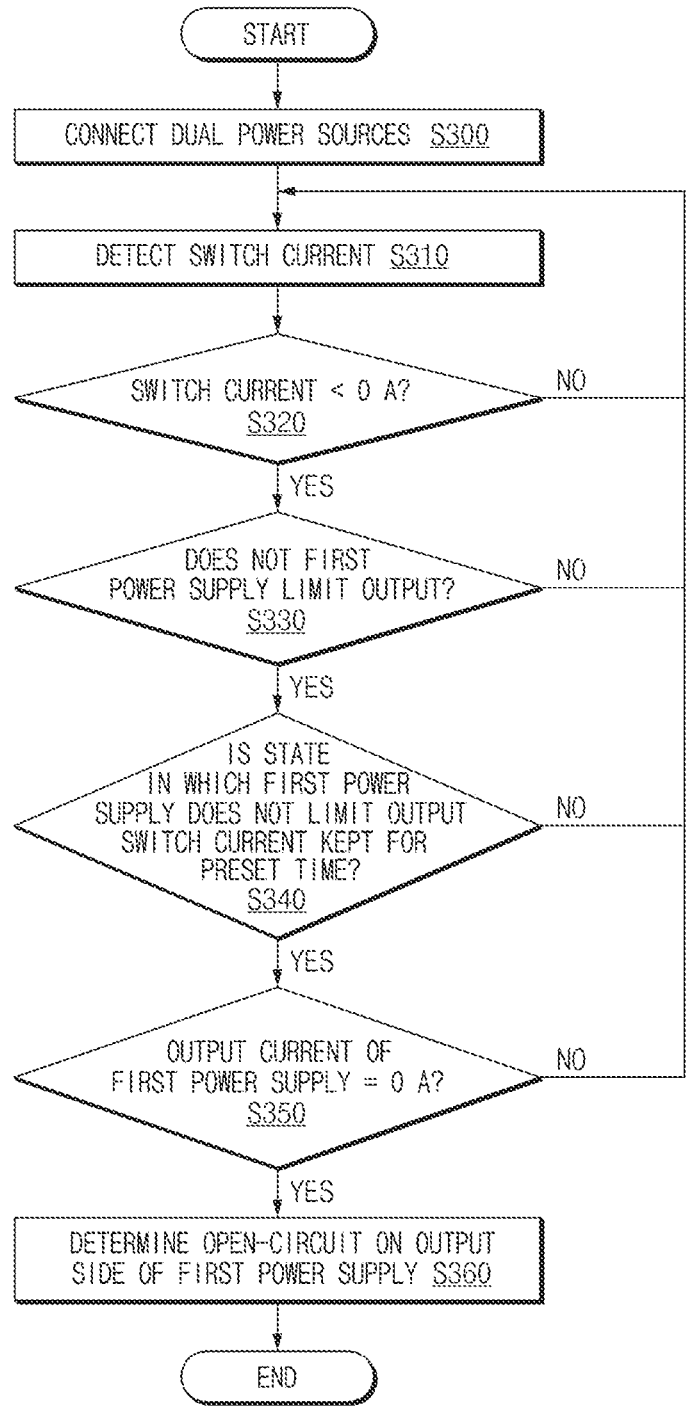
FIG. 10 is a flowchart illustrating an open-circuit diagnosis method for a power control device according to various exemplary embodiments of the present invention.

FIG. 10 is a flowchart illustrating an open-circuit diagnosis method for a power control device according to various exemplary embodiments of the present invention;

The power control device 140 may connect the dual power sources during autonomous driving (S300). The processor 147 of the power control device 140 may turn on the first power control switch 141 to connect main power output from the first power supply 110 and the auxiliary power output from the second power supply 120.

The power control device 140 may detect a switch current while the dual power sources are being connected (S310). The processor 147 may measure a current flowing through the first power control switch 141 using the first current sensor 145.

The power control device 140 may identify whether a flow direction of the switch current is the reverse direction (S320). The processor 147 may identify whether a current measured by the first current sensor 145 is less than "0" A. When the current measured by the first current sensor 145 is less than "0" A, the processor 147 may determine the flow direction of the switch current as a reverse direction.

The power control device 140 may determine whether the first power supply 110 does not limit the output (S330). The processor 147 of the power control device 140 may determine whether the first power supply 110 does not limit output through communication with the first power supply 110.

The power control device 140 may identify whether a state in which the first power supply 110 does not limit an output is maintained for a preset time (S340).

When the first power supply 110 does not limit the output for a preset time, the power control device 140 may determine whether an output current of the first power supply 110 is "0" A (S350). The processor 147 may identify the output current of the first power supply 110 using vehicle communication. The processor 147 may determine whether a current is output from the first power supply 110 based on the identified output current.

When the output current of the first power supply 110 is "0" A, the power control device 140 may determine an open-circuit fault on the output side of the first power supply 110 (S360). When a current is not supplied from the first power supply 110, the processor 147 may determine an open-circuit position between the first power supply 110 and the power distribution device 130.

Figure 11:
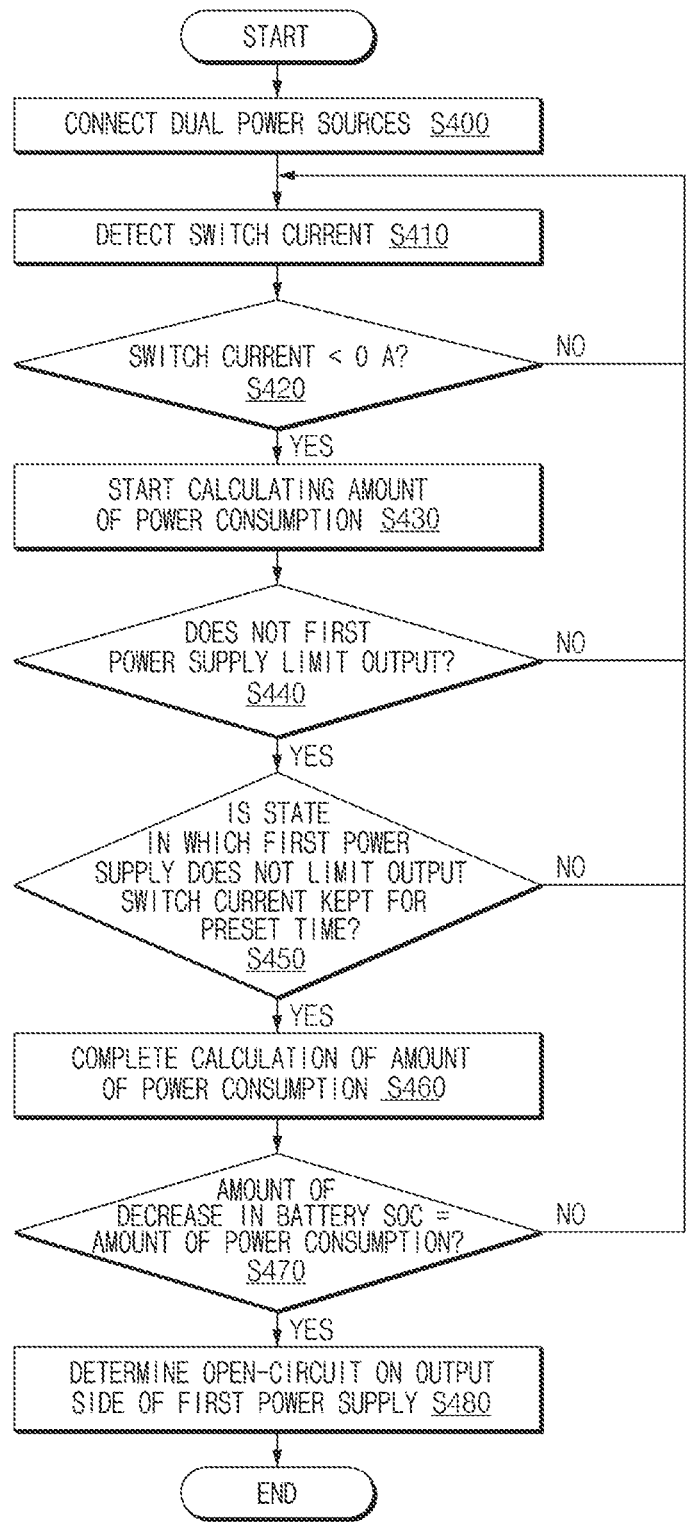
FIG. 11 is a flowchart illustrating an open-circuit diagnosis method for a power control device according to various exemplary embodiments of the present invention.

FIG. 11 is a flowchart illustrating an open-circuit diagnosis method for a power control device according to various exemplary embodiments of the present invention.

The power control device 140 may connect dual power sources during autonomous driving (S400). The processor 147 of the power control device 140 may turn on the first power control switch 141 to connect main power output from the first power supply 110 and the auxiliary power output from the second power supply 120.

The power control device 140 may detect a switch current while the dual power sources are being connected (S410). The processor 147 may measure a current flowing through the first power control switch 141 using the first current sensor 145.

The power control device 140 may identify whether a flow direction of the switch current is the reverse direction (S420). The processor 147 may identify whether a current measured by the first current sensor 145 is less than "0" A. When the current measured by the first current sensor 145 is less than "0" A, the processor 147 may determine the flow direction of the switch current as a reverse direction.

When the current flows through the first power control switch 141 in the reverse direction, the power control device 140 may start determining the power consumption of the vehicle (S430). The processor 147 may determine the power consumption of the vehicle based on the output voltage of the second power supply 120, the switch current measured by the first current sensor 145, a current of each electric load current measured by the second current sensor 146, and a measurement cycle.

The power control device 140 may determine whether the first power supply 110 does not limit an output (S440). The processor 147 of the power control device 140 may determine whether the first power supply 110 does not limit an output through communication with the first power supply 110.

The power control device 140 may identify whether a state in which the first power supply 110 does not limit an output is maintained for a preset time (S450).

When the first power supply 110 does not limit the output for a preset time, the power control device 140 may complete the determination of the power consumption of the vehicle (S460). The determination of the power consumption of the vehicle may need to be continued for a time for which it is possible to identify a decrease in the battery SOC, in consideration of an error of a sensor that measures a battery SOC value of the second power supply 120. A time required to perform the determination of the power consumption may be set according to the capacity of the auxiliary battery and/or the current consumption of the vehicle. When the current consumption of the vehicle is large, the time required to perform the determination of the power consumption may decrease, and when the consumption current of the vehicle is small, the time required to perform the determination of the power consumption may increase.

The power control device 140 may determine whether the difference between the amount of power consumption and the amount of decrease in the battery SOC is within a preset tolerance range (e.g., ±5%) (S470). The processor 147 of the power control device 140 may identify the SOC value of the auxiliary battery through IBS, BMS, or the like, and thus, determine the amount of decrease in the battery SOC. When the difference between the determined amount of power consumption and the amount of decrease in the battery SOC is within a preset tolerance range, the processor 147 may determine that the electric load 150 is driven only with power output from the second power supply 120.

When the difference between the amount of power consumption and the amount of decrease in the battery SOC is within a preset tolerance range, the power control device 140 may determine an open-circuit fault on the output of the first power supply 110 (S480). The power control device 140 may determine an open-circuit position to be between the first power supply 110 and the power distribution device 130 when driving the electric load 150 using only the output power of the second power supply 120.

Figure 12:
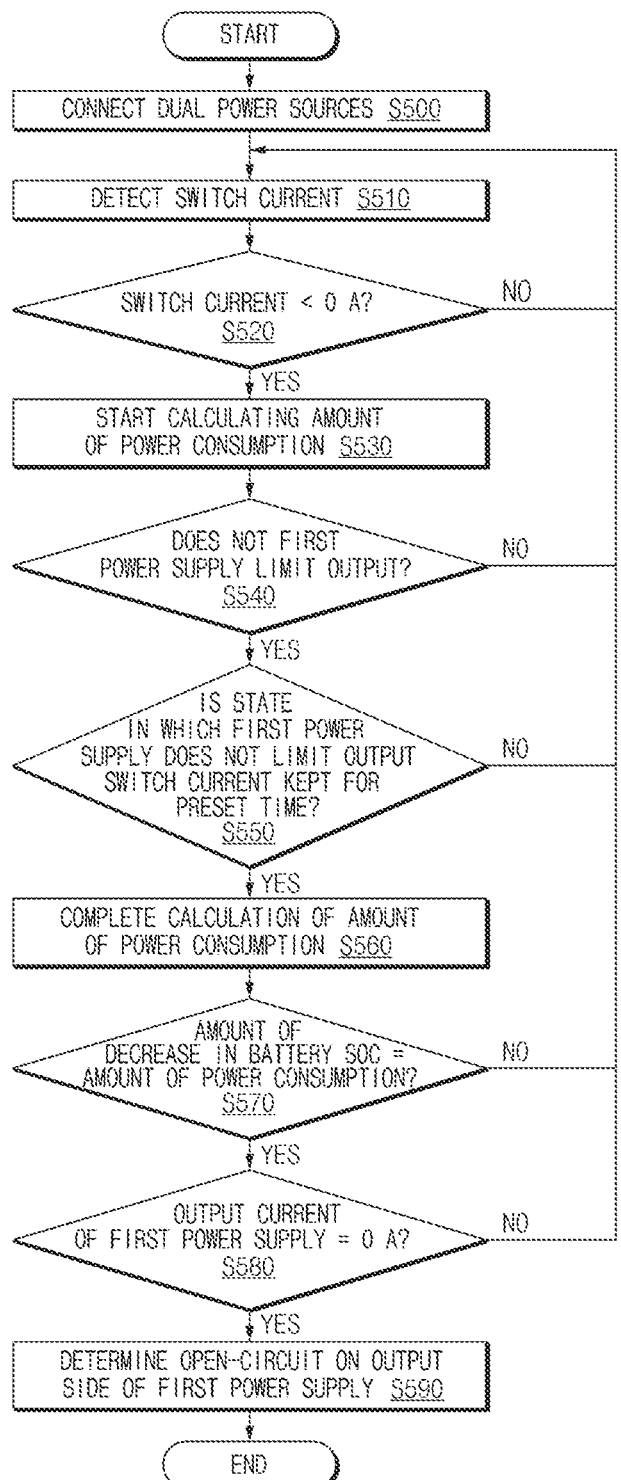
FIG. 12 is a flowchart illustrating an open-circuit diagnosis method for a power control device according to various exemplary embodiments of the present invention.

FIG. 12 is a flowchart illustrating an open-circuit diagnosis method for a power control device according to various exemplary embodiments of the present invention.

The power control device 140 may connect dual power sources during autonomous driving (S500). The processor 147 of the power control device 140 may turn on the first power control switch 141 to connect main power output from the first power supply 110 and the auxiliary power output from the second power supply 120.

The power control device 140 may detect a switch current while the dual power sources are being connected (S510). The processor 147 may measure a current flowing through the first power control switch 141 using the first current sensor 145.

The power control device 140 may identify whether a flow direction of the switch current is the reverse direction (S520). The processor 147 may identify whether a current measured by the first current sensor 145 is less than "0" A. When the current measured by the first current sensor 145 is less than "0" A, the processor 147 may determine the flow direction of the switch current as a reverse direction.

When a current flows through the first power control switch 141 in the reverse direction, the power control device 140 may start determining the power consumption of the vehicle (S530). The processor 147 may determine the power consumption of the vehicle based on the output voltage of the second power supply 120, the switch current measured by the first current sensor 145, a current of each electric load current measured by the second current sensor 146, and a measurement cycle.

The power control device 140 may determine whether the first power supply 110 does not limit an output (S540). The processor 147 of the power control device 140 may determine whether the first power supply 110 does not limit an output through communication with the first power supply 110.

The power control device 140 may identify whether a state in which the first power supply 110 does not limit an output is maintained for a preset time (S550).

When the first power supply 110 does not limit the output for a preset time, the power control device 140 may complete the determination of the power consumption of the vehicle (S560). The determination of the power consumption of the vehicle may need to be continued for a time for which it is possible to identify a decrease in the battery SOC, in consideration of an error of a sensor that measures a battery SOC value of the second power supply 120. A time required to perform the determination of the power consumption may be set according to the capacity of the auxiliary battery and/or the current consumption of the vehicle. When the current consumption of the vehicle is large, the time required to perform the determination of the power consumption may decrease, and when the consumption current of the vehicle is small, the time required to perform the determination of the power consumption may increase.

The power control device 140 may determine whether the difference between the amount of power consumption and the amount of decrease in the battery SOC is within a preset tolerance range (S570). The processor 147 of the power control device 140 may identify the SOC value of the auxiliary battery through IBS, BMS, or the like, and thus, determine the amount of decrease in the battery SOC. When the difference between the determined amount of power consumption and the amount of decrease in the battery SOC is within a preset tolerance range, the processor 147 may determine that the electric load 150 is driven only with power output from the second power supply 120.

When the difference between the amount of power consumption and the amount of decrease in the battery SOC is within a preset tolerance range, the power control device 140 may determine whether an output current of the first power supply 110 is "0" A (S580). When the power control device 140 drives the electric load 150 using only the output power of the second power supply 120, the power control device 140 may identify an output current of the first power supply 110 through communication.

When the output current of the first power supply 110 is "0" A, the power control device 140 may determine an open-circuit fault on the output side of the first power supply 110 (S590). When a current is not supplied from the first power supply 110, the power control device 140 may determine an open-circuit position between the first power supply 110 and the power distribution device 130.

Figure 13:
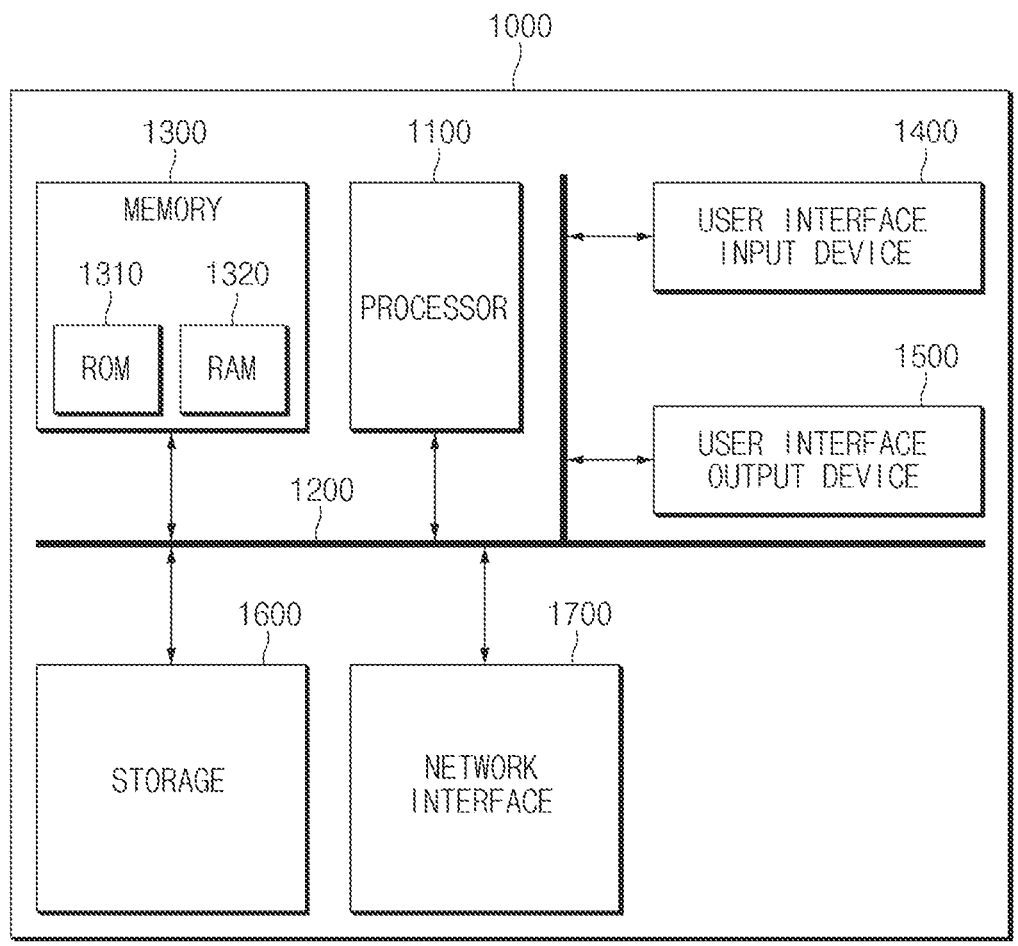
FIG. 13 is a block diagram of a computing system for executing an open-circuit diagnosis method according to exemplary embodiments of the present invention.

FIG. 13 is a block diagram of a computing system for executing an open-circuit diagnosis method according to exemplary embodiments of the present invention.

Referring to FIG. 13, a computing system 1000 may include at least one processor 1100, a memory 1300, a user interface input device 1400, a user interface output device 1500, storage 1600, and a network interface 1700, which are connected to each other via a bus 1200.

The processor 1100 may be a central processing unit (CPU) or a semiconductor device that processes instructions stored in the memory 1300 or the storage 1600. The memory 1300 and the storage 1600 may include various types of volatile or non-volatile storage media. For example, the memory 1300 may include a ROM (Read Only Memory) 1310 and a RAM (Random Access Memory) 1320.

Thus, the operations of the method or the algorithm described in connection with the exemplary embodiments included herein may be embodied directly in hardware or a software module executed by the processor 1100, or in a combination thereof. The software module may reside on a storage medium (that is, the memory 1300 or the storage 1600) such as a RAM, a flash memory, a ROM, an EPROM, an EEPROM, a register, a hard disk, a removable disk, and a CD-ROM. The exemplary storage medium may be coupled to the processor 1100, and the processor 1100 may read information out of the storage medium and may record information in the storage medium. Alternatively, the storage medium may be integrated with the processor 1100. The processor 1100 and the storage medium may reside in an application specific integrated circuit (ASIC). The ASIC may reside within a user terminal. In another case, the processor 1100 and the storage medium may reside in the user terminal as separate components.

The above description is merely illustrative of the technical idea of the present invention, and various modifications and variations may be made without departing from the essential characteristics of the present invention by those skilled in the art to which various exemplary embodiments of the present invention pertains. Accordingly, the exemplary embodiment included in various exemplary embodiments of the present invention is not intended to limit the technical idea of the present invention but to describe the present invention, and the scope of the technical idea of the present invention is not limited by the embodiment. The scope of protection of the present invention may be interpreted by the following claims, and all technical ideas within the scope equivalent thereto may be construed as being included in the scope of the present invention.

According to various exemplary embodiments of the present invention, it is possible to identify an open-circuit fault and an open-circuit position of a vehicle power source by utilizing a current flow that varies depending on the power distribution structure of the vehicle. Therefore, it is possible to establish safety measures accordingly when an open-circuit fault occurs in an autonomous vehicle.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A power control device positioned between a power distribution device connected to an output terminal of a first power supply and a second power supply, the power control device comprising:
   a power control switch configured to selectively connect or separate a main power output from the first power supply and an auxiliary power output from the second power supply; and
   a processor configured to determine a possibility of an open-circuit fault of a vehicle power source based on a current flowing through the power control switch and to determine whether it is possible to drive an electric load with an output power of the second power supply alone and to determine an open-circuit position based on an output of the first power supply upon determining that there is the possibility of the open-circuit fault,
   wherein the open-circuit position is between the power distribution device and the power control device or between the first power supply and the power distribution device.

2. The power control device of claim 1, wherein the processor is configured to conclude that there is the open-circuit fault when it is detected using a current sensor that the current does not flow through the power control switch or the current flows through the power control switch in a reverse direction, which is a direction opposite to a predetermined direction.

3. The power control device of claim 2, wherein the processor is configured to measure an output voltage of the first power supply using a voltage sensor when the current does not flow through the power control switch and to conclude that there is the open-circuit fault between the power distribution device and the power control device according to the measured output voltage.

4. The power control device of claim 2, wherein the processor is configured to determine whether the first power supply does not limit an output thereof using vehicle communication when the current flows through the power control switch in the reverse direction and to conclude that there is the open-circuit fault between the first power supply and the power distribution device upon determining that the first power supply does not limit the output.

5. The power control device of claim 4, wherein the processor is configured to conclude that there is the open-circuit fault between the first power supply and the power distribution device when the first power supply does not limit the output and a current is not supplied from the first power supply upon determining that the current flows through the power control switch in the reverse direction.

6. The power control device of claim 4, wherein the processor is configured to conclude that there is the open-circuit fault between the first power supply and the power distribution device when the first power supply does not limit the output and the electric load is driven with the output power of the second power supply alone upon determining that the current flows through the power control switch in the reverse direction.

7. The power control device of claim 4, wherein the processor is configured to conclude that there is the open-circuit fault between the first power supply and the power distribution device when the first power supply does not limit the output, the electric load is driven with the output power of the second power supply alone, and a current is not supplied from the first power supply, upon determining that the current flows through the power control switch in the reverse direction.

8. The power control device of claim 7,
   wherein the electric load is in plural to include a plurality of electric loads, and
   wherein the processor is configured to determine an amount of power consumption based on power supplied to each of the electric loads, to identify an amount of decrease in a battery state of charge (SOC) value of the second power supply using a sensor, to determine whether a difference between the amount of power consumption and an amount of decrease in the battery SOC value is within a tolerance range, and to conclude that each of the electric load is driven with the output power of the second power supply alone when the difference is within the tolerance range.

9. The power control device of claim 1,
   wherein the electric load is in plural to include a plurality of electric loads,
   wherein the power control switch of the power control device includes:
      a first power control switch connected between the power distribution device and the second power supply and controlled by the processor to selectively connect or separate the main power output from the first power supply and the auxiliary power output from the second power supply; and
      a second power control switch connected between the second power supply and a predetermined number of electric loads among the plurality of electric loads and controlled by the processor to selectively connect or separate the auxiliary power output from the second power supply to the predetermined number of electric loads among the plurality of electric loads,
   wherein remaining number of electric loads among the plurality of electric loads are connected to the power distribution device, and wherein the power control device further includes:
a voltage sensor connected between the first power supply and the first power control switch and configured to measure an output voltage of the first power supply, and
a current sensor connected between the first power control switch and the second power supply and configured to measure a current flowing through the first power control switch.

10. An open-circuit diagnosis method for a power control device positioned between a power distribution device connected to output terminals of a first power supply and a second power supply and including a processor, the open-circuit diagnosis method comprising:
determining, by the processor, a possibility of an open-circuit fault of a vehicle power source based on a current flowing through a power control switch that selectively connects or separates main power output from the first power supply and auxiliary power output from the second power supply; and
determining, by the processor, whether it is possible to drive an electric load with an output power of the second power supply alone and determining an open-circuit position based on an output of the first power supply when there is the possibility of the open-circuit fault,
wherein the open-circuit position is between the power distribution device and the power control device or between the first power supply and the power distribution device.

11. The open-circuit diagnosis method of claim 10,
wherein the electric load is in plural to include a plurality of electric loads,
wherein the power control switch of the power control device includes:
a first power control switch connected between the power distribution device and the second power supply and controlled by the processor to selectively connect or separate the main power output from the first power supply and the auxiliary power output from the second power supply; and
a second power control switch connected between the second power supply and a predetermined number of electric loads among the plurality of electric loads and controlled by the processor to selectively connect or separate the auxiliary power output from the second power supply to the predetermined number of electric loads among the plurality of electric loads,
wherein remaining number of electric loads among the plurality of electric loads are connected to the power distribution device, and
wherein the power control device further includes:
a voltage sensor connected between the first power supply and the first power control switch and configured to measure an output voltage of the first power supply, and
a current sensor connected between the first power control switch and the second power supply and configured to measure a current flowing through the first power control switch.

12. The open-circuit diagnosis method of claim 10, wherein the determining of the possibility of the open-circuit fault includes:
determining, by the processor, a current flow of the power control switch using a current sensor; and
determining, by the processor, that there is the possibility of the open-circuit fault when a current does not flow the power control switch or the current flows through the power control switch in a reverse direction which is a direction opposite to a predetermined direction, as a result of the determination of the current flow.

13. The open-circuit diagnosis method of claim 12, wherein the determining of the open-circuit position includes:
measuring an output voltage of the first power supply using a voltage sensor when the current does not flow through the power control switch; and
determining, by the processor, whether there is the open-circuit fault between the power distribution device and the power control device based on the output voltage of the first power supply.

14. The open-circuit diagnosis method of claim 12, wherein the determining of the open-circuit position includes determining whether the first power supply does not limit an output thereof using vehicle communication upon determining that the current flows through the power control switch in the reverse direction.

15. The open-circuit diagnosis method of claim 14, wherein the determining of the open-circuit position further includes concluding that there is the open-circuit fault between the first power supply and the power distribution device when the first power supply does not limit the output.

16. The open-circuit diagnosis method of claim 14, wherein the determining of the open-circuit position further includes:
identifying an output current of the first power supply upon determining that the first power supply does not limit the output; and
concluding that there is the open-circuit fault between the first power supply and the power distribution device upon determining that a current is not supplied from the first power supply.

17. The open-circuit diagnosis method of claim 14, wherein the determining of the open-circuit position includes:
determining whether the electric load is driven with the output power of the second power supply alone when the first power supply does not limit the output; and
concluding that there is the open-circuit fault between the first power supply and the power distribution device when the electric load is driven with the output power of the second power supply alone.

18. The open-circuit diagnosis method of claim 17, wherein the determining of the open-circuit position further includes:
identifying an output current of the first power supply upon determining that the electric load is driven with the output power of the second power supply alone; and
concluding that there is the open-circuit fault between the first power supply and the power distribution device upon determining that a current is not supplied from the first power supply.

19. The open-circuit diagnosis method of claim 17,
wherein the electric load is in plural to include a plurality of electric loads, and
wherein the determining of whether the electric load is driven with the output power of the second power supply alone includes:
determining an amount of power consumption based on power supplied to each of the electric loads;
identifying an amount of decrease in a battery state of charge (SOC) value of the second power supply using a sensor;

determining whether a difference between the amount of power consumption and an amount of the battery SOC value is within a tolerance range; and concluding that there is the open-circuit fault between the first power supply and the power distribution device upon determining that the difference is within the tolerance range.

\* \* \* \* \*